US009473125B2

(12) United States Patent
Yoo

(10) Patent No.: US 9,473,125 B2
(45) Date of Patent: Oct. 18, 2016

(54) COMPARATOR, ANALOG-TO-DIGITAL CONVERTING APPARATUS INCLUDING THE SAME, AND ANALOG-TO-DIGITAL CONVERTING METHOD

(71) Applicant: SK hynix Inc., Gyeonggi-do (KR)

(72) Inventor: Si-Wook Yoo, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/816,982

(22) Filed: Aug. 3, 2015

(65) Prior Publication Data

US 2016/0269005 A1 Sep. 15, 2016

(30) Foreign Application Priority Data

Mar. 9, 2015 (KR) .................. 10-2015-0032578

(51) Int. Cl.
*H03M 1/12* (2006.01)
*H03K 4/90* (2006.01)
*H03K 5/24* (2006.01)

(52) U.S. Cl.
CPC ........ *H03K 4/90* (2013.01); *H03K 5/24* (2013.01); *H03M 1/1245* (2013.01)

(58) Field of Classification Search
CPC ...... H03M 1/56; H03M 1/144; H03M 1/123; H03M 1/12; H03M 1/00; H03M 2201/16; H03M 2201/235
USPC ................... 341/144, 156, 167–170
See application file for complete search history.

(56) References Cited

U.S. PATENT DOCUMENTS

| 5,053,771 | A | * | 10/1991 | McDermott | ........ | H03M 1/188 |
| | | | | | | 341/139 |
| 6,670,904 | B1 | | 12/2003 | Yakovlev | | |
| 8,773,552 | B2 | * | 7/2014 | Egawa | .......... | H04N 5/378 |
| | | | | | | 250/208.1 |
| 8,810,676 | B2 | * | 8/2014 | Lim | ............ | H03M 1/144 |
| | | | | | | 341/156 |
| 8,922,413 | B1 | * | 12/2014 | Yoo | .............. | H03F 3/211 |
| | | | | | | 341/155 |
| 2009/0273500 | A1 | * | 11/2009 | Krymski | ..... | H03M 1/144 |
| | | | | | | 341/155 |
| 2011/0292261 | A1 | * | 12/2011 | Hwang | ...... | H04N 5/3575 |
| | | | | | | 348/294 |
| 2012/0098990 | A1 | * | 4/2012 | Jung | ......... | H04N 5/3575 |
| | | | | | | 348/222.1 |
| 2012/0113286 | A1 | * | 5/2012 | Lim | ............ | H03M 1/144 |
| | | | | | | 348/222.1 |
| 2014/0368371 | A1 | * | 12/2014 | Yoo | .............. | H03F 3/211 |
| | | | | | | 341/156 |
| 2015/0194973 | A1 | * | 7/2015 | Furuta | ......... | H03M 1/002 |
| | | | | | | 348/308 |

FOREIGN PATENT DOCUMENTS

KR    1020100120749    11/2010

OTHER PUBLICATIONS

Lim, S., et al., A High-Speed CMOS Image Sensor With Column-Parallel Two-Step Single-Slope ADCs, IEEE Transactions on Electron Devices, Mar. 2009, pp. 393-398, vol. 56, No. 3.

* cited by examiner

Primary Examiner — Linh Nguyen
(74) Attorney, Agent, or Firm — IP & T Group LLP

(57) ABSTRACT

A comparator includes a common mode voltage sampling unit suitable for sampling a common mode voltage based on a sampling control signal; a coarse ramping voltage sampling unit suitable for sampling a coarse ramping voltage based on the sampling control signal; a preamplifier suitable for amplifying a difference between an input voltage and the sampled coarse ramping voltage to output a coarse conversion result, and amplifying a difference between a fine ramping voltage and the sampled common mode voltage to output a fine conversion result; and a signal processing unit suitable for generating the sampling control signal based on the coarse conversion result, and generating a comparison signal based on the coarse conversion result and the fine conversion result.

11 Claims, 4 Drawing Sheets

COMPARATOR, ANALOG-TO-DIGITAL CONVERTING APPARATUS INCLUDING THE SAME, AND ANALOG-TO-DIGITAL CONVERTING METHOD

CROSS-REFERENCE TO RELATED APPLICATION

This application claims priority under 35 U.S.C. §119 to Korean Patent Application No. 10-2015-0032578 filed on Mar. 9, 2015 in the Korean Intellectual Property Office, the disclosure of which is incorporated herein by reference in its entirety.

TECHNICAL FIELD

Various embodiments of the present invention relate to an electronic circuit design technology, and more particularly, to a comparator, an analog-to-digital converting apparatus including the same, and an analog-to-digital converting method.

A two-step single-slope analog-to-digital converter (ADC) will be described as an example. However, embodiments of the present invention may be applied to a multi-step multi-slope ADC as well as a multi-step single-slope ADC, and may also be applied to a system requiring a high-speed multi-step single-slope ADC and a high-speed multi-step multi-slope ADC. Thus, the present invention is not limited to a two-step single-slope ADC.

DISCUSSION OF THE RELATED ART

Methods for two-step (or mufti-step) single-slope A/D conversion are disclosed in related art documents such as "Alexey Yakovlev, 'Double-Ramp ADC for CMOS Sensors', U.S. Pat. No. 6,670,904 B1, Dec. 30, 2003" and "Seunghyun Lim, 'A High-Speed CMOS Image Sensor with Column-Parallel Two-Step Single-Slope ADCs', IEEE Trans. Electron Devices, vol. 56, no. 3, pp. 393-398, March, 2009".

In the related arts, a coarse ramping voltage for most significant bit (MSB) conversion is stored in the top plate of a capacitor, an input terminal for fine ramping is coupled to the bottom plate of the capacitor during fine ramping for least significant bit (LSB) conversion, and then the voltage stored in the floated top plate of the capacitor changes according to a fine ramping voltage.

The above-described related arts have a fundamental concern in that the slopes of the coarse ramping voltage and the fine ramping voltage, which are inputted to a comparator during the coarse ramping and the fine ramping, may differ depending on the conversion process.

Also, when sampling the coarse ramping voltage during a coarse analog-to-digital conversion operation, a voltage added with an error term is sampled because of differences in ground voltage bouncing and settling of the coarse ramping voltage according to the position of each column analog-to-digital converting apparatus. This degrades the linearity of the column analog-to-digital converting apparatus, and exerts influence on banding noise. That is, according to which number of column analog-to-digital converting apparatuses simultaneously perform sampling operations among column analog-to-digital converting apparatuses and where the operating column analog-to-digital converting apparatuses are positioned, various magnitudes of ground voltage bouncing and settling issues of the coarse ramping voltage may occur.

SUMMARY

Various embodiments are directed to a comparator that may perform differential sampling by using multi-input differential terminals, an analog-to-digital converting apparatus including the same, and an analog-to-digital converting method.

In an embodiment, a comparator may include: a common mode voltage sampling unit suitable for sampling a common mode voltage based on a sampling control signal; a coarse ramping voltage sampling unit suitable for sampling a coarse ramping voltage based on the sampling control signal; a preamplifier suitable for amplifying a difference between an input voltage and the sampled coarse ramping voltage to output a coarse conversion result, and amplifying a difference between a fine ramping voltage and the sampled common mode voltage to output a fine conversion result; and a signal process unit suitable for generating the sampling control signal based on the coarse conversion result, and generating a comparison signal based on the coarse conversion result and the fine conversion result.

The sampled coarse ramping voltage and the sampled common mode voltage may have a differential relationship for the preamplifier.

The common mode voltage sampling unit may include: a switch suitable for selectively blocking the common mode voltage based on the sampling control signal; and a capacitor suitable for storing the common mode voltage when the switch is turned off.

The coarse ramping voltage sampling unit may include: a switch suitable for selectively blocking the coarse ramping voltage based on the sampling control signal; and a capacitor suitable for storing the coarse ramping voltage when the switch is turned off.

The signal processing unit may include: an amplifier suitable for amplifying the coarse conversion result and the fine conversion result; a controller suitable for generating the sampling control signal based on the amplified coarse conversion result; and a selector suitable for selecting the amplified coarse conversion result through the controller and the amplified fine conversion result based on a selection signal to output the comparison signal.

The signal processing unit may include: a controller suitable for generating the sampling control signal based on the coarse conversion result; and a selector suitable for selecting the coarse conversion result through the controller and the fine conversion result based on a selection signal to output the comparison signal.

The comparator may further include: a switch suitable for resetting the preamplifier based on a control signal.

The comparator may further include: a capacitor suitable for decoupling the input voltage and an output signal of the preamplifier, which is fed back.

The preamplifier may include: a common active load including an output terminal that is suitable for outputting the coarse conversion result and the fine conversion result; a coarse input differential pair suitable for amplifying a difference between the input voltage and the sampled coarse ramping voltage to output the coarse conversion result through the output terminal; and a fine input differential pair suitable for amplifying a difference between the fine ramping voltage and the sampled common mode voltage to output the fine conversion result through the output terminal.

In an embodiment an analog-to-digital converting apparatus may include: a common mode voltage sampling unit suitable for sampling a common mode voltage based on a sampling control signal; a coarse ramping voltage sampling unit suitable for sampling a coarse ramping voltage based on the sampling control signal; a preamplifier suitable for amplifying a difference between an input voltage and the sampled coarse ramping voltage to output a coarse conversion result, and amplifying a difference between a fine ramping voltage and the sampled common mode voltage to output a fine conversion result; signal process unit suitable for generating the sampling control signal based on the coarse conversion result, and generating a comparison signal based on the coarse conversion result and the fine conversion result; and a code decision unit suitable for determining a coarse digital code and a fine digital code based on the comparison signal to output digital data.

The sampled coarse ramping voltage and the sampled common mode voltage have a differential relationship for the preamplifier.

In an embodiment, an analog-to-digital converting method may include: sampling a common mode voltage based on a sampling control signal; sampling a coarse ramping voltage based on the sampling control signal; amplifying a difference between an input voltage and the sampled coarse ramping voltage to output a coarse conversion result; amplifying a difference between a fine ramping voltage and the sampled common mode voltage to output a fine conversion result; generating the sampling control signal based on the coarse conversion result; generating a comparison signal based on the coarse conversion result and the fine conversion result; and deciding a coarse digital code and a fine digital code based on the comparison signal to output digital data.

DETAILED DESCRIPTION

Figure 1:
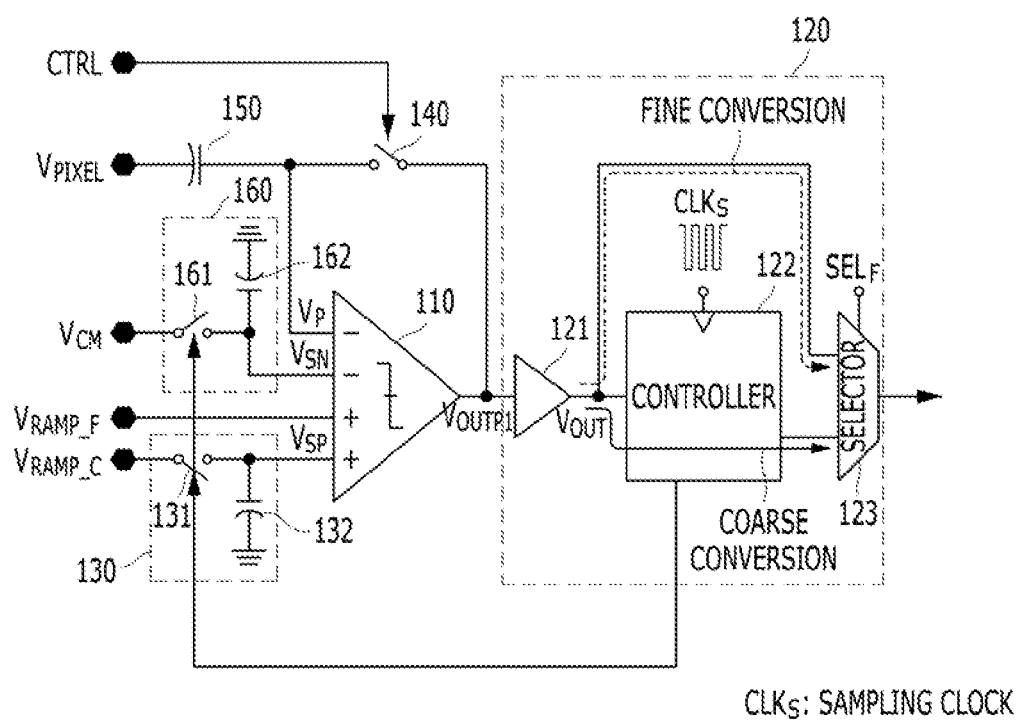
FIG. 1 is a block diagram illustrating a comparator in accordance with an embodiment of the present invention.

Various exemplary embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts in the various figures and embodiments of the present invention.

In this disclosure, when one part is referred to as being 'connected' to another part, it should be understood that the former can be 'directly connected' to the latter, or 'electrically connected' to the latter via an intervening part. Furthermore, when it is described that one comprises (or includes or has) some elements, it should be understood that it may comprise (or include or has) only those elements, or it may comprise (or includes or have) other elements as well as those elements if there is no specific limitation. The terms of a singular form may include plural forms unless stated otherwise.

FIG. 1 is a block diagram illustrating a comparator in accordance with an embodiment the present invention.

Referring to FIG. 1, the comparator may include a common mode voltage sampling unit 160, a coarse ramping voltage sampling unit 130, a preamplifier 110, and a signal processing unit 120. The common mode voltage sampling unit 160 samples a common mode voltage $V_{CM}$ according to a sampling control signal from the signal processing unit 120. The coarse ramping voltage sampling unit 130 samples a coarse ramping voltage $V_{RAMP\_C}$ according to the sampling control signal from the signal processing unit 120. The preamplifier 110 amplifies a difference between an input voltage $V_P$ and a coarse ramping voltage $V_{SP}$ from the coarse ramping voltage sampling unit 130 and outputs a coarse conversion result, and amplifies a difference between a fine ramping voltage $V_{RAMP\_F}$ and a common mode voltage $V_{SN}$ from the common mode voltage sampling unit 160 and outputs a fine conversion result. The signal processing unit 120 generates the sampling control signal according to the coarse conversion result from the preamplifier 110, and outputs a comparison signal according to the coarse conversion result and the fine conversion result from the preamplifier 110, to a counter and/or a line memory.

The common mode signal sampling unit 160 includes a switch 161 and a capacitor 162. The switch 161 blocks the common mode voltage $V_{CM}$ according to the sampling control signal from the signal processing unit 120, and the capacitor 162 stores the common mode voltage $V_{CM}$ when the switch 161 is turned off.

The coarse ramping voltage sampling unit 130 includes a switch 131 and a capacitor 132. The switch 131 blocks the coarse ramping voltage $V_{RAMP\_C}$ according to the sampling control signal from the signal process unit 120, and the capacitor 132 stores the coarse ramping voltage $V_{RAMP\_C}$ when the switch 131 is turned off.

The signal processing unit 120 includes an amplifier 121, a controller 122, and a selector 123. The amplifier 121 amplifies the coarse conversion result and the fine conversion result from the preamplifier 110. The controller 122 generates the sampling control signal according to the coarse conversion result from the amplifier 121. The selector 123 selects the coarse conversion result from the controller 122 and the fine conversion result from the amplifier 121 according to a selection signal $SEL_F$ (for example, transferred from a timing generator), and outputs a comparison signal to a counter and/or a line memory. The coarse conversion result is transferred to the selector 123 from the controller 122 in synchronization with a sampling clock CLKs. The amplifier 121 serves as an additional component element, and the coarse conversion result from the preamplifier 110 is transferred to the controller 122 and the fine conversion result from the preamplifier 110 is transferred to the selector 123.

The comparator may further include a switch 140 for resetting the preamplifier 110 according to a control signal CTRL. That is, the switch 140 functions to turn on/off the output voltage of the preamplifier 110, which is fed back to an input terminal for inputting the input voltage $V_P$, according to the control signal CTRL from an external controller (not illustrated), and thereby reset (i.e., auto zero state) the preamplifier 110.

The comparator further includes a capacitor 150 for decoupling an input voltage $V_{PIXEL}$ which is to be A/D converted and the output voltage which is fed back from the preamplifier 110.

In this way, a sampling unit for sampling the coarse ramping voltage $V_{RAMP\_C}$ and a sampling unit for sampling the common mode voltage $V_{CM}$ are disposed at respective terminals of a dual input differential pair (that is, dual input differential terminals). As a consequence, uniform sampling values may be acquired irrespective of the position of a column analog-to-digital converting apparatus, whereby linearity may be maintained and banding noise may be removed. Also, although a coarse ramping voltage and a common mode voltage retain floating states after they are sampled and are influenced by various sources of noise, since they are processed differentially to have immunity, horizontal noise may be effectively removed.

Figure 2:
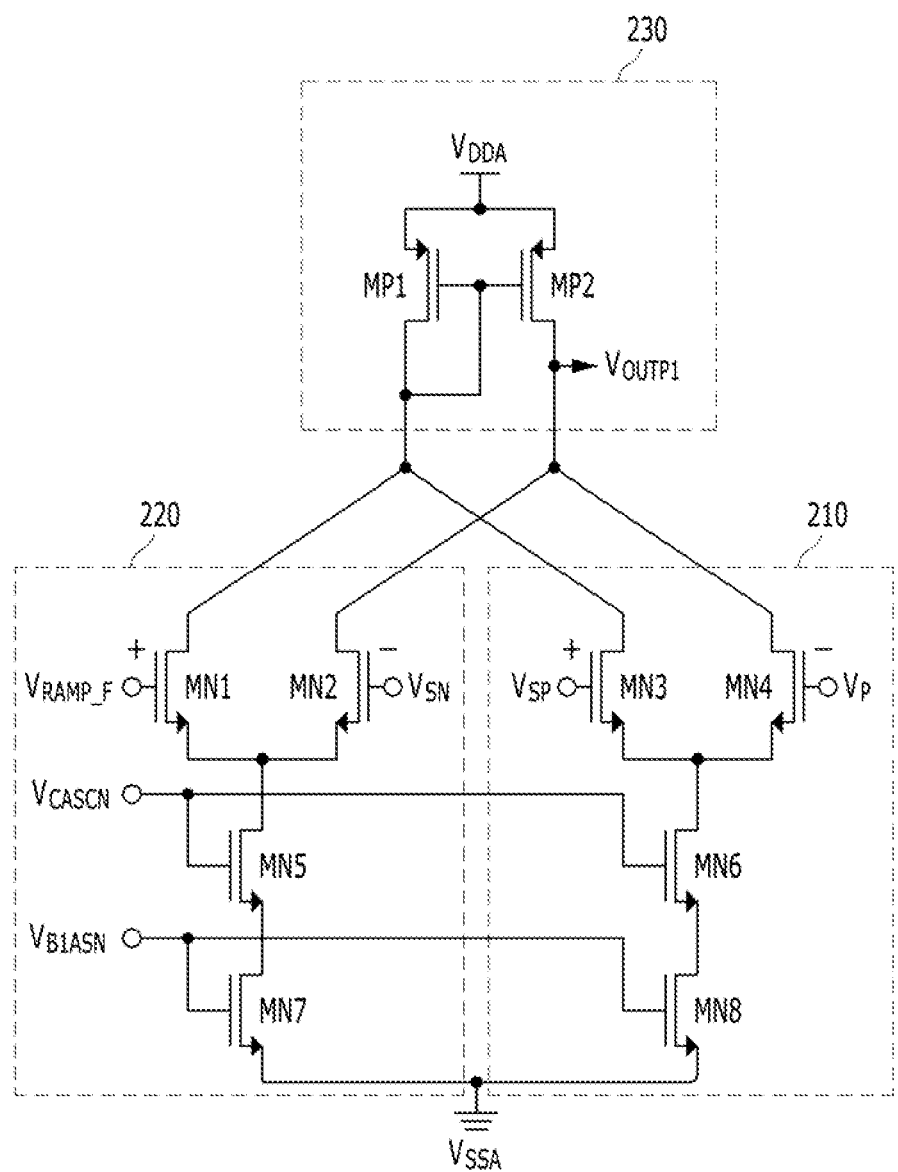
FIG. 2 is a detailed diagram of a preamplifier shown in FIG. 1.

FIG. 2 is a detailed diagram of the preamplifier 110 shown in FIG. 1.

Referring to FIG. 2, the preamplifier 110 may include a common active load 230, a coarse input differential pair 210, and a fine input differential pair 220. The common active load 230 provides an output terminal which outputs the coarse conversion result and the fine conversion result. The coarse input differential pair 210 amplifies a difference between the input voltage $V_P$ and the coarse ramping voltage $V_{SP}$ from the coarse ramping voltage sampling unit 130 and outputs the coarse conversion result through the output terminal. The fine input differential pair 220 amplifies a difference between the fine ramping voltage $V_{RAMP\_F}$ and the common mode voltage $V_{SN}$ from the common mode voltage sampling unit 160 and outputs the fine conversion result through the output terminal.

Preamplifier

The input differential pair (that is, the input differential terminals) is divided into multi-steps for coarse conversion and fine conversion. In other words, a first transistor MN1 and a second transistor MN2 form the fine input differential pair 220 for the fine conversion, and a third transistor MN3 and a fourth transistor MN4 form the coarse input differential pair 210 for the coarse conversion.

The coarse input differential pair 210 directly receives and compares the input voltage $V_P$ and the coarse ramping voltage $V_{SP}$ from the coarse ramping voltage sampling unit 130. The coarse conversion result obtained by amplifying the difference between the input voltage $V_P$ and the coarse ramping voltage $V_{SP}$ from the coarse ramping voltage sampling unit 130 is outputted through an output terminal $V_{OUTP1}$ of the common active load 230, and is transferred to the signal processing unit 120. The coarse input differential pair 210 may be referred to as coarse input differential terminals.

The fourth transistor MN4 of the coarse input differential pair 210 has a gate terminal to which the input voltage $V_P$ to be A/D converted is applied, and the third transistor MN3 has a gate terminal to which the coarse ramping voltage $V_{SP}$ from the coarse ramping voltage sampling unit 130 is directly applied.

The fine input differential pair 220 amplifies the difference between the fine ramping voltage $V_{RAMP\_F}$ and the common mode voltage $V_{SN}$ from the common mode voltage sampling unit 160, and outputs the fine conversion result to the signal processing unit 120 through the output terminal $V_{OUTP1}$ of the common active load 230. A common mode voltage from an external common mode voltage generation unit (not illustrated) is used as a bias voltage, and the common mode voltage $V_{SN}$ from the common mode voltage sampling unit 160 may be the same voltage as the starting level of the fine ramping voltage $V_{RAMP\_F}$. The fine input differential pair 220 may be referred to as fine input differential terminals.

The first transistor MN1 of the fine input differential pair 220 has a gate terminal to which the fine ramping voltage $V_{RAMP\_F}$ is directly applied, and the second transistor MN2 has a gate terminal to which the common mode voltage $V_{SN}$ from the common mode voltage sampling unit 160, the same as the starting level of the fine ramping voltage $V_{RAMP\_F}$, is directly applied.

Since the differential amplification operations of the fine input differential pair 220 including the first, second, fifth and seventh transistors MN1, MN2, MN5 and MN7 and the coarse input differential pair 210 including the third, fourth, sixth and eighth transistors MN3, MN4, MN6 and MN8 are generally known in the art, further descriptions thereof will be omitted. Also, the common active load 230 constructed by two transistors MP1 and MP2 serve as an output terminal, and, since the configuration and operations of the common active load 230 are generally known in the art, further descriptions thereof will be omitted.

Figure 3:
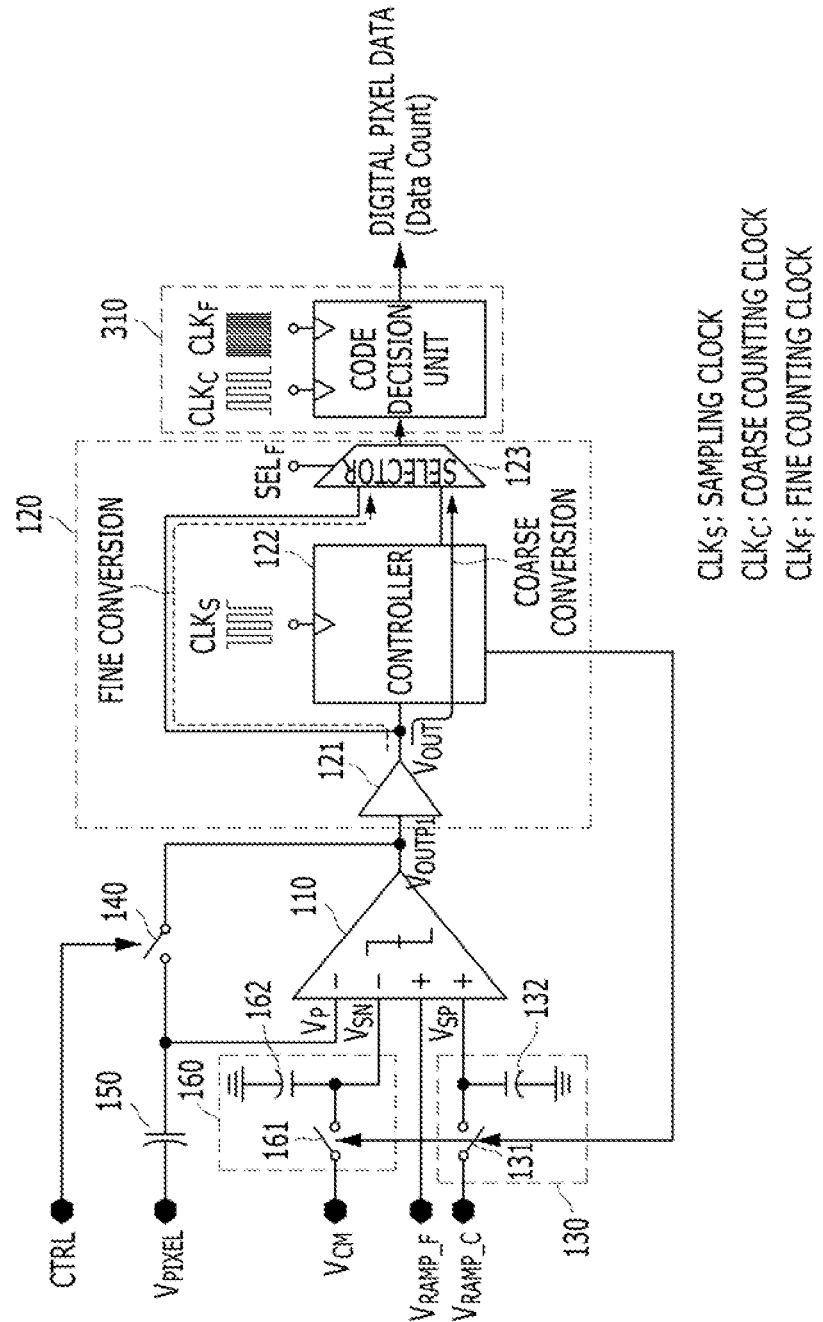
FIG. 3 is a block diagram illustrating an analog-to-digital converting apparatus in accordance with an embodiment of the present invention.

FIG. 3 is a block diagram illustrating an analog-to-digital converting apparatus in accordance with an embodiment of the present invention.

Referring to FIG. 3, the analog-to-digital converting apparatus may include the comparator shown in FIG. 1 and a code decision unit 310.

Namely, the analog-to-digital converting apparatus may include a common mode voltage sampling unit 160, a coarse ramping voltage sampling unit 130, a preamplifier 110, a signal processing unit 120, and the code decision unit 310. The common mode voltage sampling unit 160 samples a common mode voltage $V_{CM}$ according to a sampling control signal from the signal processing unit 120. The coarse ramping voltage sampling unit 130 samples a coarse ramping voltage $V_{RAMP\_C}$ according to the sampling control signal from the signal processing unit 120. The preamplifier 110 amplifies a difference between an input voltage $V_P$ and a coarse ramping voltage $V_{SP}$ from the coarse ramping voltage sampling unit 130 and outputs a coarse conversion result, and to amplify a difference between a fine ramping voltage $V_{RAMP\_F}$ and a common mode voltage $V_{SN}$ from the common mode voltage sampling unit 160 and output a fine conversion result. The signal processing unit 120 generates the sampling control signal according to the coarse conversion result from the preamplifier 110, and outputs a comparison signal according to the coarse conversion result and the fine conversion result from the preamplifier 110, to a counter and/or a line memory. The code decision unit 310 determines a coarse digital code and a fine digital code according to the comparison signal from the signal processing unit 120 and outputs digital pixel data $D_{OUT}$.

The code decision unit 310 determines a code by using a coarse counter clock $CLK_C$ and a fine counter clock $CLK_F$. The code decision unit 310 may include a counter (for example, an up/down counter) and/or a line memory receiving a count value.

Figure 4:
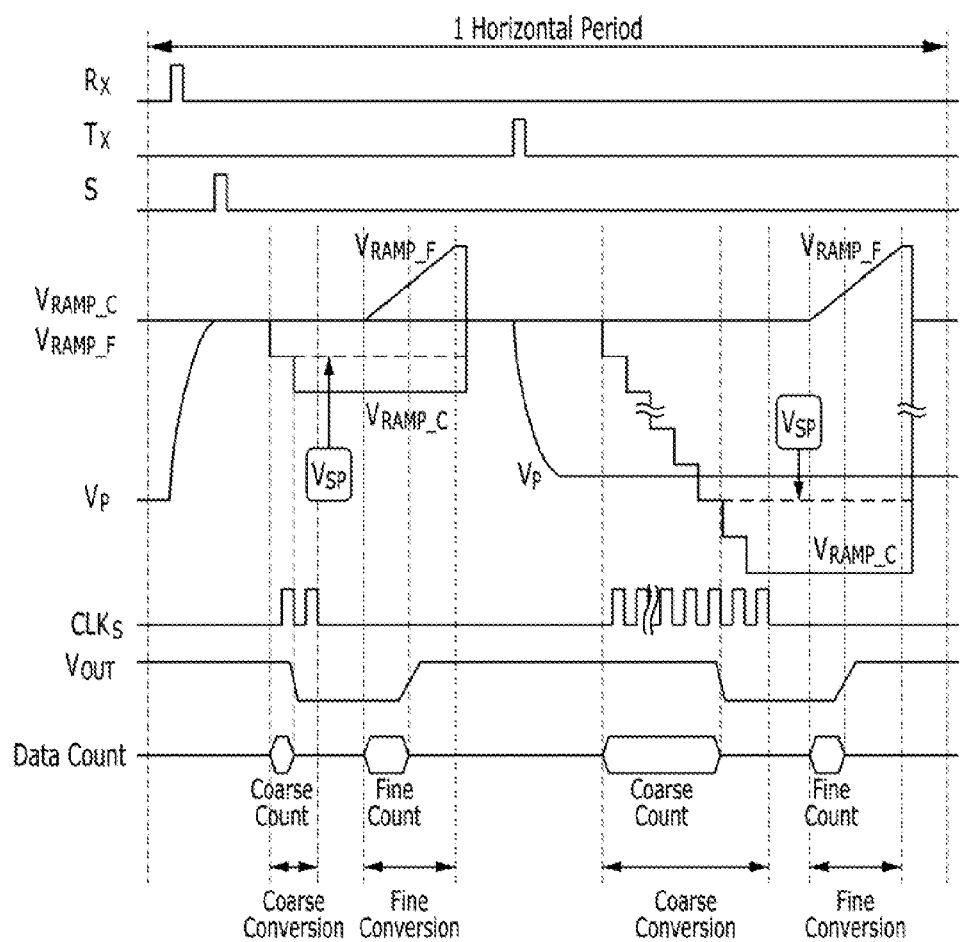
FIG. 4 is a timing diagram for describing an operation of the comparator, and the analog-digital converting apparatus shown in FIGS. 1 to 3.

FIG. 4 is a timing diagram for describing an operation of the comparator and the analog-digital converting apparatus shown in FIGS. 1 to 3.

In the first step, the coarse input differential pair 210 compares the input voltage $V_P$ and the coarse ramping voltage $V_{SP}$ from the coarse ramping voltage sampling unit 130. The difference between the input voltage $V_P$ and the coarse ramping voltage $V_{SP}$ from the coarse ramping voltage sampling unit 130 is amplified and outputted through the output terminal $V_{OUTP1}$ of the preamplifier 110, that is, the output terminal of the common active load 230, and is transferred to the signal processing unit 120.

The output voltage causes the sampling control signal to be generated by the signal processing unit 120, and turns off the switch 131 through which the coarse ramping voltage $V_{RAMP\_C}$ passes, by which the coarse ramping voltage VRAMP_C is stored in the capacitor 132. Also, at the same time, the signal processing unit 120 transfers the comparison signal to a counter of a corresponding column and/or a line memory receiving a count value, such that a coarse digital code is determined.

In the second step, the fine input differential pair 220 amplifies the difference between the fine ramping voltage $V_{RAMP\_F}$ and the common mode voltage $V_{SN}$ from the common mode voltage sampling unit 160, and outputs the fine conversion result. The output voltage is transferred to the signal processing unit 120 through the output terminal $V_{OUTP1}$ of the preamplifier 110, that is, the output terminal of the common active load 230. Then, the signal processing unit 120 transfers the comparison signal to a counter which is positioned in a column or a line memory receiving a count value, such that a fine digital code is determined.

As the above-described steps are performed multiple times, multi-step single-slope A/D conversion is possible.

As is apparent from the above descriptions, in accordance with the embodiments of the present invention, the coarse ramping voltage $V_{RAMP\_C}$ and the common mode voltage $V_{CM}$ are applied to the respective terminals of the dual input differential pair, and thus, a differential relationship results when viewed over the entire circuit (that is, the coarse input differential pair and the fine input differential pair have a differential relationship). Therefore, since commonly applied noise is suppressed, immunity to noise may be achieved. The noise may include ground voltage bouncing and coarse ramping voltage bouncing by the charge feedthrough and the clock feedthrough of a sampling switch. After sampling, influence may be exerted by ground fluctuation.

Although various embodiments have been described for illustrative purposes, it will be apparent to those skilled in the art that various changes and modifications may be made without departing from the spirit and scope of the invention as defined in the following claims.

What is claimed:

1. A comparator comprising:
   a common mode voltage sampling unit suitable for sampling a common mode voltage based on a sampling control signal;
   a coarse ramping voltage sampling unit suitable for sampling a coarse ramping voltage based on the sampling control signal;
   a preamplifier suitable for amplifying a difference between an input voltage and the sampled coarse ramping voltage to output a coarse conversion result, and amplifying a difference between a fine ramping voltage and the sampled common mode voltage to output a fine conversion result; and
   a signal processing unit suitable for generating the sampling control signal based on the coarse conversion result, and generating a comparison signal based on the coarse conversion result and the fine conversion result,
   wherein the signal processing unit comprises:
      an amplifier suitable for amplifying the coarse conversion result and the fine conversion result;
      a controller suitable for generating the sampling control signal based on the amplified coarse conversion result; and
      a selector suitable for selecting the amplified coarse conversion result through the controller and the amplified fine conversion result based on a selection signal to output the comparison signal.

2. The comparator of claim 1, wherein the sampled coarse ramping voltage and the sampled common mode voltage have a differential relationship for the preamplifier.

3. The comparator of claim 1, wherein the common mode voltage sampling unit comprises:
   a switch suitable for selectively blocking the common mode voltage based on the sampling control signal; and
   a capacitor suitable for storing the common mode voltage when the switch is turned off.

4. The comparator of claim 1, wherein the coarse ramping voltage sampling unit comprises:
   a switch suitable for selectively blocking the coarse ramping voltage based on the sampling control signal; and
   a capacitor suitable for storing the coarse ramping voltage when the switch is turned off.

5. The comparator of claim 1, wherein the signal processing unit comprises:
   a controller suitable for generating the sampling control signal based on the coarse conversion result; and
   a selector suitable for selecting the coarse conversion result through the controller and the fine conversion result based on a selection signal to output the comparison signal.

6. The comparator of claim 1, further comprising:
   a switch suitable for resetting the preamplifier based on a control signal.

7. The comparator of claim 1, further comprising:
   a capacitor suitable for decoupling the input voltage and an output signal of the preamplifier, which is fed back.

8. The comparator of claim 1, wherein the preamplifier comprises:
   a common active load including an output terminal that is suitable for outputting the coarse conversion result and the fine conversion result;
   a coarse input differential pair suitable for amplifying a difference between the input voltage and the sampled coarse ramping voltage to output the coarse conversion result through the output terminal; and
   a fine input differential pair suitable for amplifying a difference between the fine ramping voltage and the sampled common mode voltage to output the fine conversion result through the output terminal.

9. An analog-to-digital converting apparatus comprising:
   a common mode voltage sampling unit suitable for sampling a common mode voltage based on a sampling control signal;
   a coarse ramping voltage sampling unit suitable for sampling a coarse ramping voltage based on the sampling control signal;
   a preamplifier suitable for amplifying a difference between an input voltage and the sampled coarse ramping voltage to output a coarse conversion result, and amplifying a difference between a fine ramping voltage and the sampled common mode voltage to output a fine conversion result;
   a signal processing unit suitable for generating the sampling control signal based on the coarse conversion result, and generating a comparison signal based on the coarse conversion result and the fine conversion result; and
   a code decision unit suitable for determining a coarse digital code and a fine digital code based on the comparison signal to output digital data,
   wherein the signal processing unit comprises:
      an amplifier suitable for amplifying the coarse conversion result and the fine conversion result;

a controller suitable for generating the sampling control signal based on the amplified coarse conversion result; and a selector suitable for selecting the amplified coarse conversion result through the controller and the amplified fine conversion result based on a selection signal to output the comparison signal.

10. The analog-to-digital converting apparatus of claim 9, wherein the sampled coarse ramping voltage and the sampled common mode voltage have a differential relationship for the preamplifier.

11. An analog-to-digital converting method comprising:

sampling a common mode voltage based on a sampling control signal;

sampling a coarse ramping voltage based on the sampling control signal;

amplifying a difference between an input voltage and the sampled coarse ramping voltage to output a coarse conversion result;

amplifying a difference between a fine ramping voltage and the sampled common mode voltage to output a fine conversion result;

amplifying the coarse conversion result and the fine conversion result;

generating the sampling control signal based on the amplified coarse conversion result;

selecting the amplified coarse conversion result through the controller and the amplified fine conversion result based on a selection signal to output a comparison signal; and determining a coarse digital code and a fine digital code based on the comparison signal to output digital data.

\* \* \* \* \*